United States Patent
Ahn et al.

(10) Patent No.: US 9,490,015 B2
(45) Date of Patent: Nov. 8, 2016

(54) SEMICONDUCTOR MEMORY DEVICE, MEMORY SYSTEM HAVING THE SAME, AND METHOD OF OPERATING THE SAME

(71) Applicant: SK hynix Inc., Icheon-si Gyeonggi-do (KR)

(72) Inventors: Jung Ryul Ahn, Namyangju-si (KR); Jum Soo Kim, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 18 days.

(21) Appl. No.: 14/563,350

(22) Filed: Dec. 8, 2014

(65) Prior Publication Data

US 2016/0012895 A1    Jan. 14, 2016

(30) Foreign Application Priority Data

Jul. 8, 2014  (KR) ........................ 10-2014-0085405

(51) Int. Cl.
  *G11C 16/04* (2006.01)
  *G11C 16/10* (2006.01)
  *G11C 11/56* (2006.01)

(52) U.S. Cl.
  CPC .......... *G11C 16/10* (2013.01); *G11C 11/5628* (2013.01); *G11C 11/5671* (2013.01); *G11C 16/0483* (2013.01); *G11C 2211/5641* (2013.01); *G11C 2211/5648* (2013.01)

(58) Field of Classification Search
  CPC .......... G11C 11/5628; G11C 11/5642; G11C 16/0483; H01L 27/115
  USPC ....................................... 365/185.03, 185.17
  See application file for complete search history.

(56) References Cited

U.S. PATENT DOCUMENTS 7,558,148 B2 *  7/2009  Sukegawa ........... G06F 13/1668
                                                                365/185.02

FOREIGN PATENT DOCUMENTS

KR    1020090080588 A    7/2009
KR    1020110001701 A    1/2011

* cited by examiner

*Primary Examiner* — Huan Hoang
(74) *Attorney, Agent, or Firm* — William Park & Associates Ltd.

(57) ABSTRACT

A semiconductor memory device, a memory system having the same, and a method of operating the same are provided. The semiconductor memory device includes a plurality of memory cells electrically coupled between a source select transistor and a drain select transistor, a peripheral circuit configured to perform a program operation on the plurality of memory cells, and a control logic unit configured to control the operation of the peripheral circuit so that at least two memory cells of the plurality of memory cells adjacent to the source select transistor and at least two memory cells of the plurality of memory cells adjacent to the drain select transistor are programmed to have a relatively fewer number of data bits than that of remaining memory cells of the plurality of memory cells in the program operation.

19 Claims, 7 Drawing Sheets

SEMICONDUCTOR MEMORY DEVICE, MEMORY SYSTEM HAVING THE SAME, AND METHOD OF OPERATING THE SAME

CROSS-REFERENCE TO RELATED APPLICATION

The present application claims priority to Korean patent application number 10-2014-0085405, filed on Jul. 8, 2014, the entire disclosure of which is incorporated herein in its entirety by reference.

BACKGROUND

1. Field of the Invention

Various embodiments relate to a semiconductor memory device, a memory system having the same, and a method of operating the same.

2. Discussion of Related Art

Semiconductor memory devices are storage devices that are typically implemented using a semiconductor, such as for example silicon (Si), germanium (Ge), a gallium arsenide (GaAs), indium phosphrous (InP), or the like. Semiconductor memory devices are often classified as either a volatile memory device or a non-volatile memory device.

A volatile memory device is a memory device that retains stored data as long as power is supplied to the volatile memory device. Stored data is lost when power to a volatile memory device is interrupted. Examples of volatile memory devices include, but are not limited to, a static random access memory (SRAM), a dynamic random access memory (DRAM), and a synchronous DRAM (SDRAM). A non-volatile memory is a memory device that retains stored even when power supplied to the non-volatile memory device is interrupted. Examples of a non-volatile memory device include, but are not limited to, a read-only memory (ROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). Flash memories may be classified as one of a NOR-type flash memory and a NAND-type flash memory.

Flash memories are typically configured as either a two-dimensional semiconductor device where a plurality of strings are horizontally formed on a semiconductor substrate and a three-dimensional semiconductor device where a plurality of strings are vertically formed on the substrate.

Each of the plurality of strings includes a drain select transistor, memory cells, and a source select transistor that are electrically coupled in series between a bit line and a source line.

SUMMARY

In an embodiment, a semiconductor memory device includes a plurality of memory cells electrically coupled between a source select transistor and a drain select transistor, a peripheral circuit configured to perform a program operation on the plurality of memory cells, and a control logic unit configured to control at least one operation of the peripheral circuit so that at least two memory cells of the plurality of memory cells adjacent to the source select transistor and at least two memory cells of the plurality of memory cells adjacent to the drain select transistor are programmed to have a relatively fewer number of data bits than that of remaining memory cells of the plurality of memory cells in the program operation.

In an embodiment, a semiconductor memory device includes a plurality of memory cells electrically coupled between a source select transistor and a drain select transistor; a peripheral circuit configured to perform a program operation on the plurality of memory cells in the program operation, and a control logic unit configured to control at least one operation of the peripheral circuit so that at least two first memory cells of the plurality of memory cells adjacent to the source select transistor and at least two second memory cells of the plurality of memory cells adjacent to the drain select transistor are programmed by a SLC program method and a MLC program method, and remaining memory cells of the plurality of memory cells are programmed by a TLC program method in the program operation.

In an embodiment, a memory system includes a semiconductor memory device including a plurality of memory cells, and a controller configured to receive a program command from a host and to transfer a command signal and an address for controlling a program operation of the semiconductor memory device to the semiconductor memory device, wherein the controller is configured to control at least one program operation of the semiconductor memory device so that at least two first memory cells of the plurality of memory cells adjacent to a source select transistor and at least two second memory cells of the plurality of memory cells adjacent to a drain select transistor are programmed to have a relatively fewer number of data bits than that of remaining memory cells of the plurality of memory cells in the program operation.

In an embodiment, a method of operating a semiconductor method device includes a string including a source select transistor, first memory cells, main memory cells, second memory cells, and a drain select transistor electrically coupled in series, including programming the main memory cells to have at least three data bits, and programming the first memory cells adjacent to the source select transistor and the second memory cells adjacent to the drain select transistor to a relatively fewer number of data bits than that of the main memory cells.

DETAILED DESCRIPTION

Various embodiments will be described with reference to the accompanying drawings It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 1:
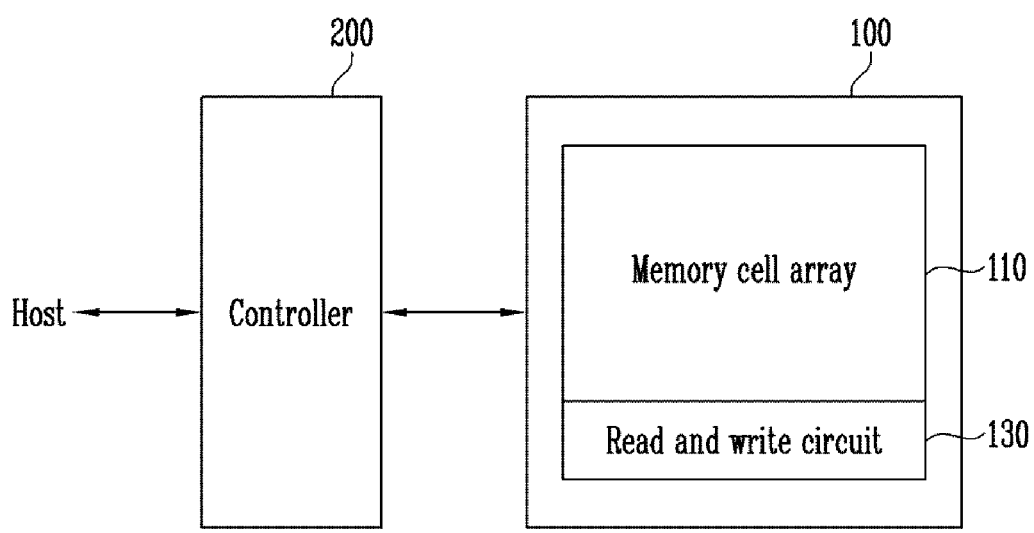
FIG. 1 is a block diagram representation of an embodiment of a memory system having a semiconductor memory device.

FIG. 1 is a block diagram representation of an embodiment of a memory system 10.

The memory system 10 may include a semiconductor memory device 100 and a controller 200. The semiconductor device 100 may be electrically coupled to the controller 200. The semiconductor memory device 100 may include a memory cell array 110, and a read/write circuit 130. The read/write circuit 130 may be electrically coupled to the memory cell array 110.

The memory cell array 110 may include a plurality of memory cells. In an embodiment, each of the plurality of memory cells may be a triple level cell (TLC) capable of storing three-bit data. In an embodiment each of the plurality of memory cells may be a quad level cell (QLC) capable of storing four-bit data.

The semiconductor memory device 100 may operate in response to one or more commands received from the controller 200. When a program command is received from the controller 200 at the semiconductor memory device 100, the semiconductor memory device 100 may be configured to responsively perform a program operation on the memory cells (selected memory cells) associated with the address received with the program command.

In an embodiment, the semiconductor memory device 100 may be a flash memory device. However, alternative embodiments of the semiconductor memory device 100 are not limited thereto.

The controller 200 may be electrically coupled to the semiconductor memory device 100 and to a host. The controller 200 may be configured operate as an interface between the host and the semiconductor memory device 100. For example, in a program operation according to a request received from the host, the controller 200 may convert a logical block address received from the host into a physical block address, and provide the converted physical block address together with a corresponding command to the semiconductor memory device 100. When the program command is received from the host, the controller 200 may control the program operation of the semiconductor memory device 100 so that memory cells adjacent to source and drain select transistors from the plurality of memory cells in the semiconductor memory device 100 may be programmed to have a relatively fewer number of data bits than that of the remaining memory cells.

Figure 2:
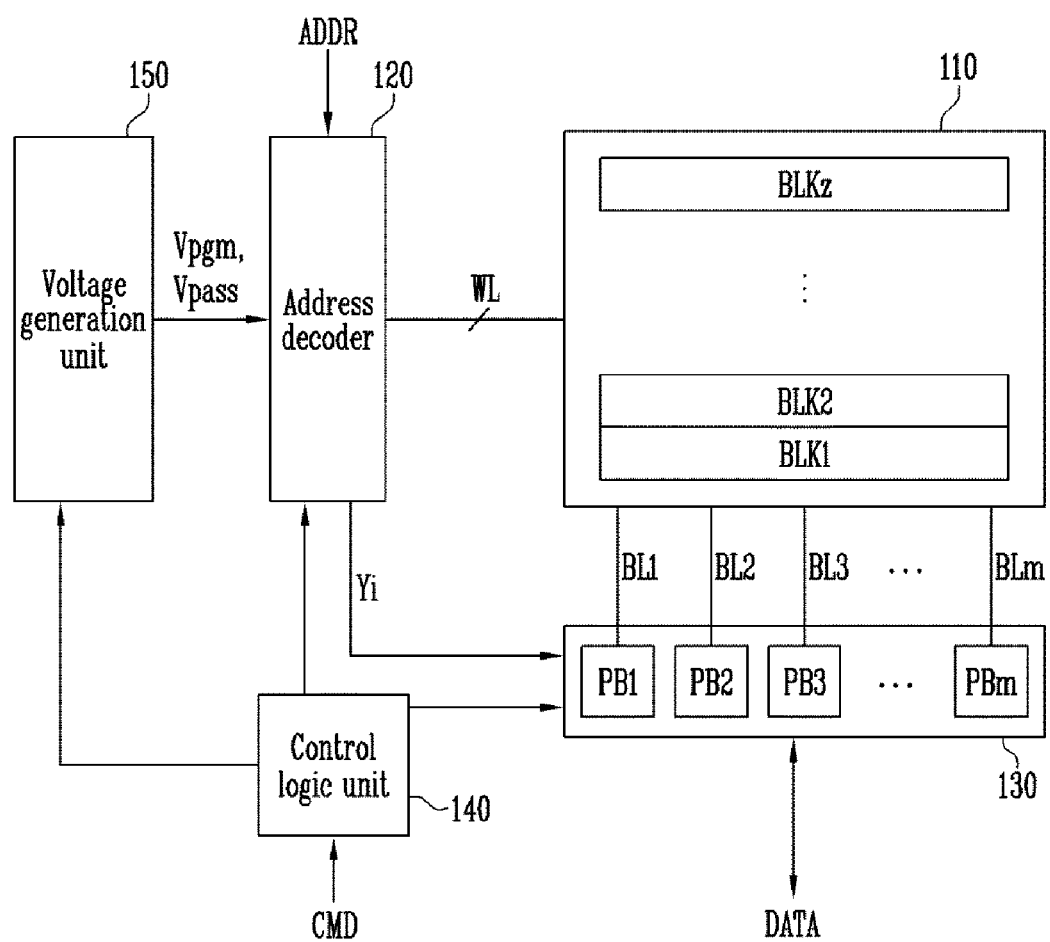
FIG. 2 is a block diagram representation of an embodiment of a semiconductor memory device.

FIG. 2 is a block diagram representation of an embodiment of a semiconductor memory device 100.

The semiconductor memory device 100 may include a memory cell array 110, an address decoder 120, a read/write circuit 130, a control logic unit 140, and a voltage generation unit 150.

The memory cell array 110 may include a plurality of memory blocks BLK1-BLKz. The plurality of memory blocks BLK1-BLKz may be electrically coupled to the address decoder 120 via word lines WL. The plurality of memory blocks BLK1-BLKz may be electrically coupled to the read/write circuit 130 via bit lines BL1-BLm. Each of the plurality of memory blocks BLK1-BLKz may include a plurality of memory cells. In an embodiment, the plurality of memory cells may be non-volatile memory cells. In an embodiment, the plurality of memory cells may be non-volatile memory cells based on a charge trap device. Memory cells electrically coupled to the same word line may be referred to as a single page. The memory cell array 110 may be configured as a plurality of pages. Each of the plurality of memory blocks BLK1-BLKz of the memory cell array 110 may include a plurality of strings. Each of the plurality of strings may include a drain select transistor, a drain side dummy cell, a plurality of memory cells, a source side dummy cell, and a source select transistor electrically coupled in series between a bit line and a source line. During the performance of a program operation, memory cells adjacent to the drain side dummy cell and the source side dummy cell from the plurality of memory cells may be programmed to have a relatively fewer number of data bits than that of the remaining memory cells. The memory cells adjacent to the drain side dummy cell may include at least two memory cells and the memory cells adjacent to the source side dummy cell may include at least two memory cells. The at least two memory cells adjacent to the drain side dummy cell may be programmed to have a different number of data bits during the performance of a program operation. The at least two memory cells adjacent to the source side dummy cell may be programmed to have a different number of data bits during the performance of a program operation.

The combination of the address decoder 120, the read/write circuit 130, and the voltage generation unit 150 may operate as a peripheral circuit for driving the memory cell array 110.

The address decoder 120 may be electrically coupled to the memory cell array 110 via the word lines WL. The address decoder 120 may be configured to operate under the control of the control logic unit 140. The address decoder 120 may receive the address ADDR via an input/output buffer (not shown) in the semiconductor memory device 100.

During the performance of a program voltage applying operation, the address decoder 120 may be configured to decode a row address included in the received address ADDR, and to apply a program voltage Vpgm and a pass voltage Vpass generated by the voltage generation unit 150 to a plurality of word lines WL of the memory cell array 110, where the plurality of word lines WL are selected based on the decoded row address.

The program operation of the semiconductor memory device 100 may be performed in units of pages. An address ADDR received in a program operation request may include a block address, a row address, and a column address. The address decoder 120 may select a memory block and a word line according to the received block address and row address. The column address may be decoded by the address decoder 120 and the decoded column address may be provided to the read/write circuit 130.

The address decoder 120 may include, for example, a block decoder, a row decoder, a column decoder, and an address buffer.

The read/write circuit 130 may include a plurality of page buffers PB1-PBm. Each of the plurality of page buffers PB1-PBm may be electrically coupled to the memory cell array 110 via an associated bit line BL1-BLm. During the performance of a program operation, each of the plurality of page buffers PB1-PBm may temporarily store input data DATA, and control the electrical potentials of the corresponding bit lines BL1-BLm in accordance with the temporarily stored data. The read/write circuit 130 may operate under the control of the control logic unit 140.

The control logic unit 140 may be electrically coupled to the address decoder 120, the read/write circuit 130, and the voltage generation unit 150. The control logic unit 140 may receive a command CMD via an input/output buffer (not shown) of the semiconductor memory device 100. The control logic unit 140 may be configured to control various operations of the semiconductor memory device 100 in response to the received command CMD. During the performance of the program operation, the control logic unit 140 may be configured to control the operation of the peripheral circuit so that memory cells adjacent to the source and drain side dummy cells are programmed to have a relatively fewer number of data bits than the remaining cells in the plurality of memory cells. For example, the memory cells adjacent to the source and drain side dummy cells may be programmed using single level cell (SLC) and multi level cell (MLC) program methods, and the remaining memory cells may be programmed using the triple level cell (TLC) or the quad level cell (QLC) program methods.

During the performance of a program operation, the voltage generation unit 150 may be configured to generate the program voltage Vpgm and the pass voltage Vpass under the control of the control logic unit 140.

Figure 3:
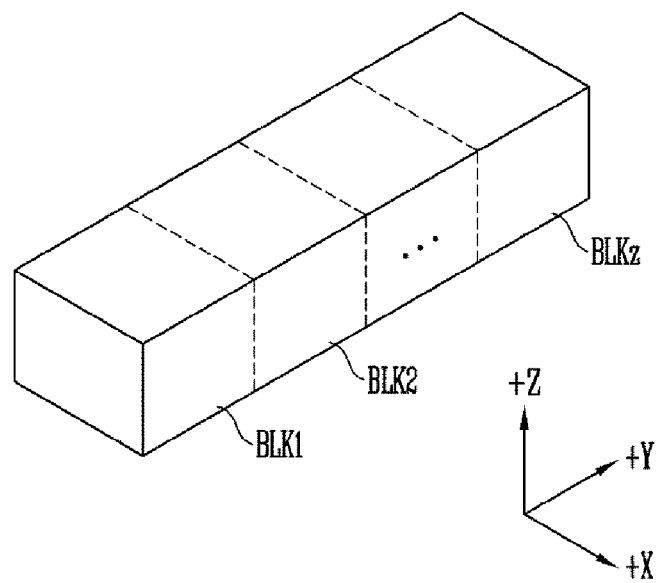
FIG. 3 is a block diagram representation of an embodiment of a memory cell array shown in FIG. 2.

FIG. 3 is a block diagram representation of an embodiment of a memory cell array 110 shown in FIG. 2.

The memory cell array 110 may include a plurality of memory blocks BLK1-BLKz. Each of the plurality of memory blocks BLK1-BLKz may have a three-dimensional configuration. Each of the plurality of memory blocks may have a plurality of memory cells in a stacked configuration on a substrate. The plurality of memory cells may be arranged in the directions of +X, +Y, and +Z. The structure of the memory blocks will be described below with reference to FIGS. 4 and 5.

Figure 4:
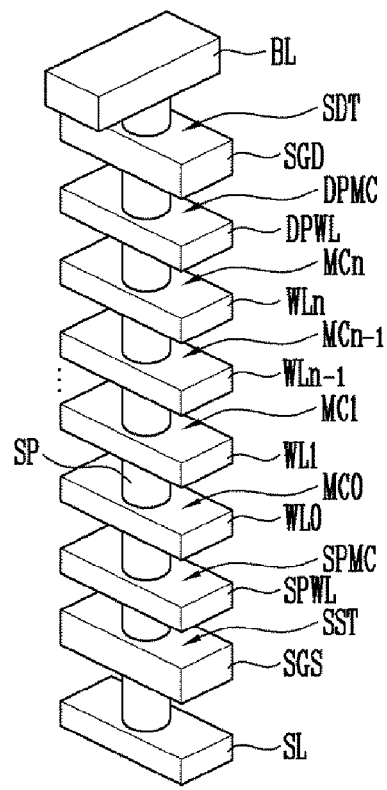
FIG. 4 is a diagram representation of an embodiment of a memory string having a three dimensional configuration in a memory block.
Figure 5:
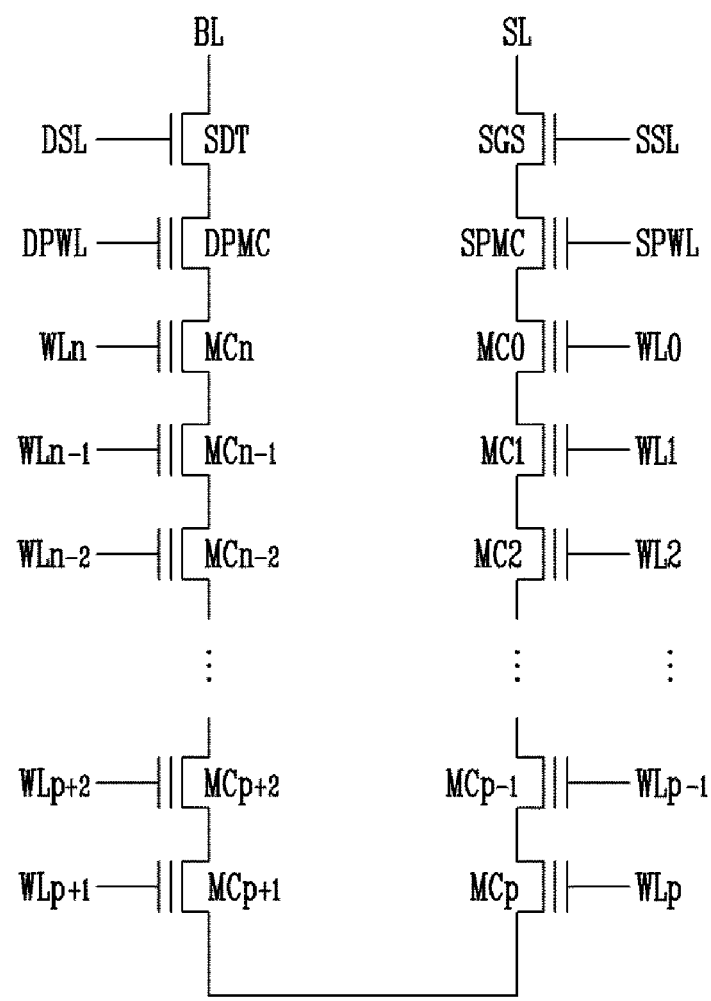
FIG. 5 is a circuit diagram representation of an embodiment of the memory string shown in FIG. 4.

FIG. 4 is a diagram representation of an embodiment of a memory string having a three dimensional configuration in a memory block. FIG. 5 is a circuit diagram representation of an embodiment of the memory string shown in FIG. 4.

Referring to FIGS. 4 and 5, a common source line SL may be formed on a semiconductor substrate. A vertical channel layer SP may be formed on and extend vertically from the common source line SL. An upper portion of the vertical channel layer SP may be connected to a bit line BL. The vertical channel layer SP may be formed from a polysilicon material. A plurality of conductive layers SGS, SPWL, WL0 to WLn, DPWL, SGD may be formed to encircle the vertical channel layer SP at different heights along the length of the vertical channel layer SP. A multilayer film (not shown) including a charge storage film may be formed on a surface of the vertical channel layer SP. The multilayer film may be formed between the vertical channel layer SP and each of the conductive films SGS, SPWL, WL0-WLn, DPWL, SGD. The multilayer film may be formed as a oxide-nitride-oxide (ONO) structure where an oxide film, a nitride film, and an oxide film are sequentially stacked.

The lowermost conductive film disposed along the length of the vertical channel layer SP may be a source select line (or a first select line) SGS and the uppermost conductive film disposed along the length of the vertical channel layer SP may be a drain select line (or a second select line) SGD. The conductive films disposed between the select lines SGS, SGD and along the length of the vertical channel layer may be a source side word line SPWL, word lines WL0-WLn, and a drain side word line DPWL. The conductive films SGS, SPWL, WL0-WLn, DPWL, SGD may be formed in a multilayer configuration on the semiconductor substrate. The vertical channel layer SP extending through the conductive films SGS, SPWL, WL0-WLn, DPWL, SGD may be vertically connected between the bit line BL and the source line SL formed on the substrate.

A drain select transistor (or a second select transistor) SDT may be formed at a junction where the uppermost conductive film SGD encircles the vertical channel layer SP. A source select transistor (or a first select transistor) SST may be formed at a junction where the lowermost conductive film SGS encircles the vertical channel layer SP. A source side dummy memory cell SPMC, the plurality of memory cells MC0-MCn, and a drain side dummy memory cell DPMC may each be formed at the junctions where the conductive films SPWL, WL0-WLn, and DPWL encircle the vertical channel layer SP, respectively.

In the above-described structure, the memory string may include the source select transistor SST, the source side dummy memory cell SPMC, the memory cells MC0-MCn, the drain side dummy memory cell DPMC, and the drain select transistor SDT connected between the common source line SL and the bit line BL in a vertical direction with respect to the substrate. The source select transistor SST may electrically couple the source side dummy memory cell SPMC and the memory cells MC0-MCn to the common source line SL according to the first select signal applied to a first select line SGS. The drain select transistor SDT may electrically couple the drain side dummy memory cell DPMC and the memory cells MC0-MCn to the bit line BL according to the second select signal applied to a second select line SGD.

Figure 6:
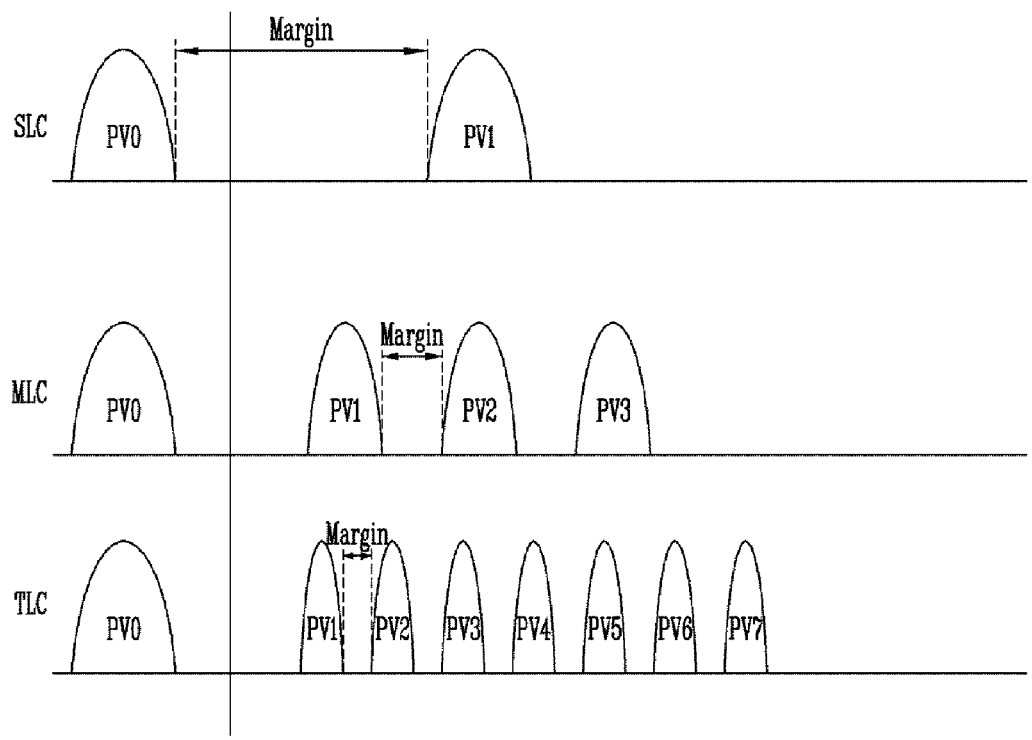
FIG. 6 is a graphical representation of threshold voltage distributions according to an embodiment of a program method.

FIG. 6 is a graphical representation of a threshold voltage distribution according to an embodiment of a program method.

An embodiment of a method of operating a semiconductor memory device will be described below with reference to FIGS. 2 to 6.

During the program voltage applying operation of the program operation, the voltage generation unit 150 may generate a program voltage Vpgm and a pass voltage Vpass under the control of the control logic unit 140. During the performance of the program voltage applying operation, the address decoder 120 may decode a row address included in a received address ADDR, and may apply the program voltage Vpgm and the pass voltage Vpass generated by the voltage generation unit 150 to the plurality of word lines WL of the memory cell array 110 according to the decoded row address.

After completing the program voltage applying operation, the control logic unit 140 may control the operation of the peripheral circuit and issue one or more commands associated with performing a program verifying operation. The program verifying operation may verify a program status of selected memory cells using the plurality of page buffers PB1-PBm of the read/write circuit 130 following the application of a verifying voltage to a word line of the selected memory cells. Following the completion of the program verifying operation on the selected memory cells, if the selected memory cells are determined to have passed, the program operation may be performed on the following page.

When the program operation is performed, the control logic unit 140 may program at least two of the memory cells MC0, MC1 adjacent to the source side dummy memory cell SPMC and at least two of the memory cells MCn-MCn-1 adjacent to the drain side dummy memory cell DWPL to have a relatively fewer number of data bits than that of the remaining memory cells MC2-MCn-2 among the plurality of memory cells. For example, when the remaining memory cells MC2-MCn-2 are programmed using the TLC program method of programming three data bits in a single cell, the memory cells MC0, MC1 adjacent to the source side dummy memory cell SPMC and the memory cells MCn, MCn-1 adjacent to the drain side dummy memory cell DWPL may be programmed using the SLC program method of programming one data bit in a single cell and a MLC program method of programming two data bits in a single cell. Each of the memory cells MC0, MC1 adjacent to the source side dummy memory cell SPMC may be programmed using a different program method and each of the memory cells MCn, MCn-1 adjacent to the drain side dummy memory cell DWPL may be programmed using a different program method.

When a hot carrier injection (HCI) disturb phenomenon occurs during a program operation of the memory cells adjacent to the source and drain select transistors SST, DST, an error rate associated with the HCI disturb phenomenon may be reduced by programming the adjacent memory cells using the SLC and MLC program methods. The SLC and MLC program methods have a relatively wider threshold voltage distribution margin than the TLS program method. When the number of the drain side dummy memory cell DPMC and the source side dummy memory cell SPMC arranged between the memory cells and each of the source and drain select transistors SST, DST is not increased, the HCI disturb phenomenon may be reduced or suppressed.

By programming the memory cells MC0, MC1, MCn, MCn-1 adjacent to the source and drain select transistors SST and DST using different program methods, a total number of data bits of the memory cells MC0, MC1 adjacent to the source side dummy memory cell SPMC may be three. The TLC program method may have eight threshold voltage distributions PV0-PV7 to store the three-bit data. When programming the two memory cells using the SLC program method and the MLC program method, the three-bit data may be stored using six threshold voltage distributions, PV0 and PV1 threshold voltage distributions in the SLC program method and PV0-PV3 threshold voltage distributions in the MLC program method. When programming data corresponding to the PV7 threshold voltage distributions, a retention characteristic may be relatively vulnerable among the three-bit data and data corresponding to the PV1 threshold voltage distributions may be vulnerable to interference by the SLC program method, since the PV1 threshold voltage distributions and the PV7 threshold voltage distributions do not exist in the same page, efficiency of an error check and correct (ECC) operation of checking and correcting an error of data received from the semiconductor memory device 100 using an error correcting code (ECC) may be improved.

In the embodiment described above, each of the plurality of memory cells is a triple level cell (TLC) capable of storing three-bit data, and an example is described where the memory cells MC0, MC1, MCn, MCn-1 adjacent to the source and drain select transistors SST, DST are programmed using different methods. However, embodiments are not limited thereto. When the number of the memory cells MC0, MC1, MC2, MCn, MCn-1, MCn-2 adjacent to each of the source and drain select transistors SST, DST is three, the memory cells MC0, MC1, MC2, MCn, MCn-1, MCn-2 may be programmed using the SLC program method. That is, a program method may be selected where a total number of data bits stored in each of the adjacent memory cells in one direction is equal to the number of data bits stored in each of the remaining memory cells.

When each of the plurality of memory cells is a quad level cell QLC capable of storing four-bit data and the number of the memory cells MC0, MC1, MCn, MCn-1 adjacent to each of the source and drain select transistors SST, DST is two, the memory cells MC0, MC1, MCn MCn-1 may be programmed using the MLC program method capable of storing two-bit data. When the number of the memory cells MC0, MC1, MC2, MCn, MCn-1 MCn-2 adjacent to each of the source and drain select transistors SST, DST is three, the memory cells MC0, MC1, MC2, MCn, MCn-1, MCn-2 may be programmed using the SLC program method and the MLC program method. When the number of the memory cells MC0, MC1, MC2, MC3, MCn, MCn-1, MCn-2, MCn-3 adjacent to each of the source and drain select transistors SST, DST is four, the memory cells MC0, MC1, MC2, MC3, MCn, MCn-1, MCn-2, MCn-3 may be programmed using the SLC program method.

Figure 7:
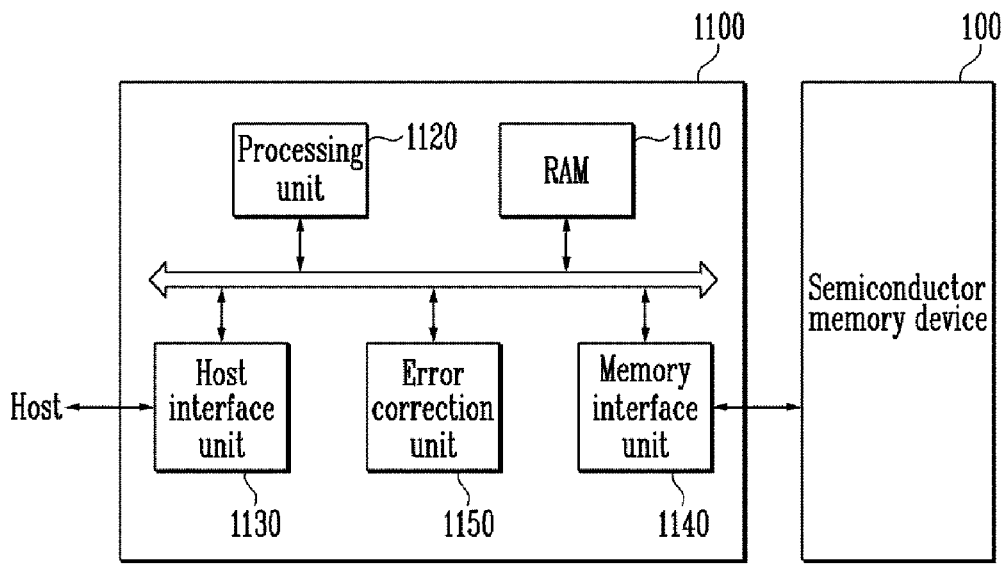
FIG. 7 is a block diagram representation of an embodiment of a memory system including the semiconductor memory device shown in FIG. 2.

FIG. 7 is a block diagram representation of an embodiment of a memory system 1000 including the semiconductor memory device 100 shown in FIG. 2.

The memory system 1000 may include a semiconductor memory device 100, and a controller 1100.

The semiconductor memory device 100 may have substantially the same construction and operation as that described with reference to FIG. 2.

The controller 1100 may be electrically coupled to a host and to the semiconductor memory device 100. The controller 1100 may be configured to access the semiconductor memory device 100 in response to a request from the host. For example, the controller 1100 may be configured to control the read, write, erase, and background operations of the semiconductor memory device 100. The controller 1100 may be configured to provide an interface between the semiconductor memory device 100 and the host. The controller 110 may be configured to drive firmware for controlling the operation of the semiconductor memory device 100.

The controller 1100 may include a random access memory (RAM) 1110, a processing unit 1120, a host interface unit 1130, a memory interface unit 1140, and an error correction unit 1150. The RAM 1110 may be used as at least one of an operating memory of the processing unit 1120, a cache memory between the semiconductor memory device 100 and the host, and a buffer memory between the semiconductor memory device 100 and the host. The processing unit 1120 may control various operations of the controller 1100. The controller 1100 may temporarily store program data provided by the host in the write operation.

The host interface unit 1130 may include a protocol for performing data exchanges between the host and the controller 1100. In an embodiment, the controller 1100 may be configured to communicate with the host through at least one of various different interface protocols, such as for example a Universal Serial Bus (USB) protocol, a multi-media card (MMC) protocol, a peripheral component interconnect (PCI) protocol, a peripheral component interconnect-express (PCI-E) protocol, an advanced technology attachment (ATA) protocol, a serial advanced technology attachment (SATA) protocol, a parallel advanced technology attachment (PATA) protocol, a small computer system interface (SCSI) protocol, an enhanced small device interface (ESDI) protocol, and an integrated drive electronics (IDE), a private protocol.

The memory interface unit 1140 may interface with the semiconductor memory device 100. The memory interface unit may, for example, include a NAND-interface or a NOR-interface.

The error correction unit 1150 may be configured to detect an error in data received from the semiconductor memory device 100 using an error correcting code, and may correct the detected error. The processing unit 1120 may adjust a read voltage according to an error detection result generated by the error correction unit 1150, and issue a command to the semiconductor memory device 100 to perform the read operation again. In an embodiment, the error correction unit 1150 may be a component of the controller 1100.

The controller 1100 and the semiconductor memory device 100 may be integrated into a single semiconductor device. In an embodiment, the controller 1100 and the semiconductor memory device 100 may be configured as a memory card integrated into a single semiconductor device. The controller 1100 and the semiconductor memory device 100 may be configured as a memory card, such as for example a personal computer memory card international association (PCMCIA) card, a compact flash (CF) card, a smart media (SM) card (SMC), a memory Stick, an MMC, a reduced sized MMC (RS-MMC), a micro sized MMC (MMCmicro), a secure digital (SD) card, a mini SD (miniSD) card, a micro SD (microSD) card, a SD high capacity (SDHC) card, and a universal flash storage (UFS) device.

The controller 1100 and the semiconductor memory device 100 may be configured as a solid state drive (SSD) integrated into a single semiconductor device. The SSD may include a storage device configured to store data in the semiconductor memory device 100. When the memory system 1000 is configured to be used as the SSD, an operating speed of the host electrically coupled to the memory system 2000 may be improved.

In an embodiment, the memory system 1000 may be provided as one of the components of an electronic device, such as for example a computer, an ultra mobile personal computer (UMPC), a workstation, a net-book, a personal digital assistant (PDA), a portable computer, a web tablet, a wireless phone, an e-book, a portable multimedia player (PMP), a portable game console, a navigation device, a black box, a digital camera, a three-dimensional television, a digital audio recorder, a digital audio player, a digital picture recorder, a digital picture player, a digital video recorder, a digital video player, a device for wirelessly transmitting and receiving information, one among various electronic devices configuring a home network, one among various electronic devices configuring a computer network, one among various electronic devices configuring a telematics network, and a radio frequency identification (RFID) device.

In an embodiment, the semiconductor memory device 100 or the memory system 1000 may be packaged as a number of different types of packages. For example, the semiconductor memory device 100 or the memory system 1000 may be packaged and mounted as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

Figure 8:
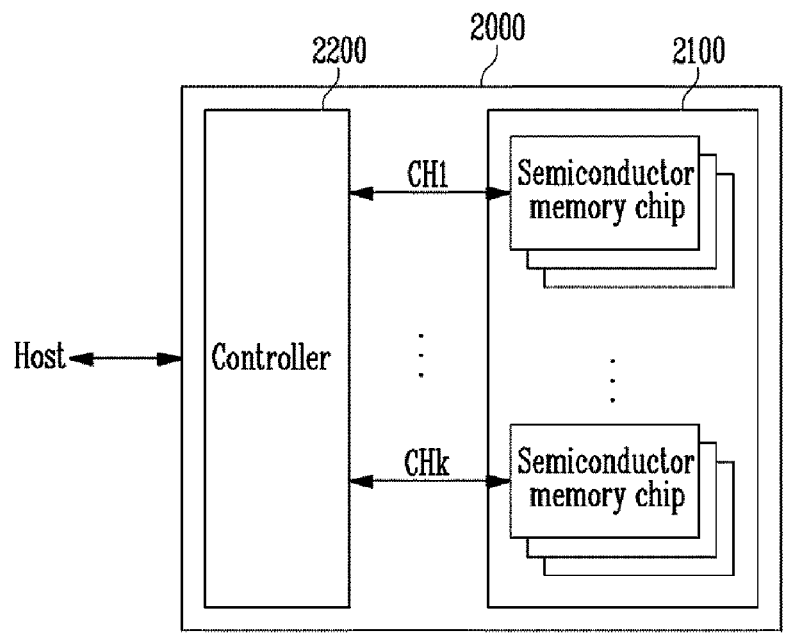
FIG. 8 is a block diagram representation of an embodiment of an application of the memory system shown in FIG. 7.

FIG. 8 is a block diagram representation of an application example of an embodiment of the memory system shown in FIG. 7.

The memory system 2000 may include a semiconductor memory device 2100 and a controller 2200. The semiconductor memory device 2100 may include a plurality of semiconductor memory chips. The plurality of semiconductor memory chips may divided into a plurality of groups.

Each of the plurality of semiconductor memory chip groups may be configured to communicate with the controller 2200 through associated one of first to k-th channels CH1-CHk. Each of the semiconductor memory chips may have substantially the same construction and operation as the semiconductor memory device 100 described with reference to FIG. 2.

Each of the plurality of semiconductor memory chip groups may be configured to communicate with the controller 2200 via a common channel. The controller 2200 may be configured to have substantially the same construction as the controller 1100 described with reference to FIG. 7 and may control the operation of the plurality of semiconductor memory chips of the semiconductor memory device 2100 through the plurality of channels CH1-CHk.

Figure 9:
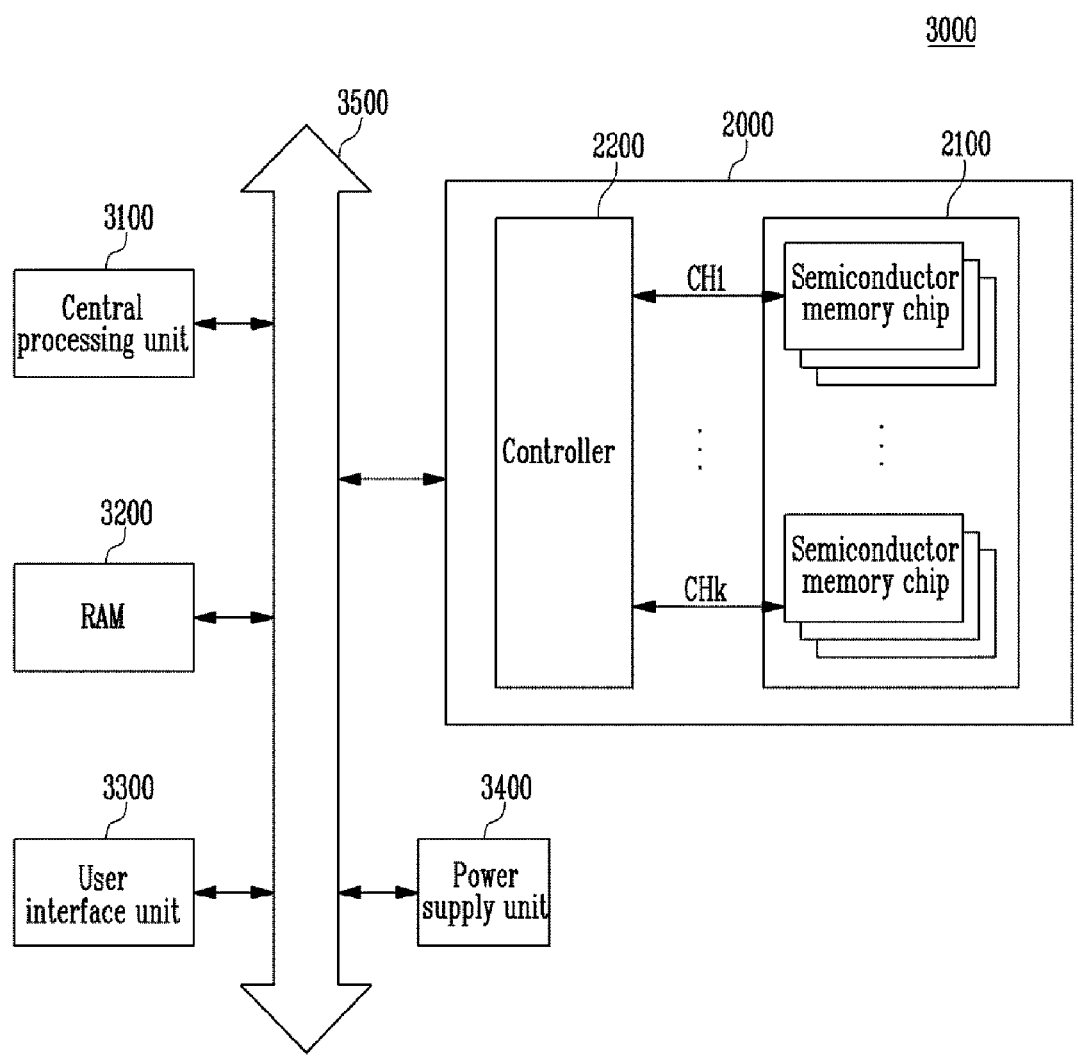
FIG. 9 is a block diagram representation of an embodiment of a computing system including the memory system described with reference to FIG. 8.

FIG. 9 is a block diagram representation of an embodiment of a computing system 3000 including the memory system described with reference to FIG. 8.

The computing system 3000 may include a central processing unit 3100, a RAM 3200, a user interface unit 3300, a power supply unit 3400, a system bus 3500, and a memory system 2000.

The memory system 2000 may be electrically coupled to the central processing unit 3100, the RAM 3200, the user interface unit 3300, and the power supply unit 3400 via the system bus 3500. Data received through the user interface unit 3300 or processed by the central processing unit 3100 may be stored in the memory system 2000.

In FIG. 9, the semiconductor memory device 2100 is illustrated as being electrically coupled to the system bus 3500 through the controller 2200. However, the semiconductor memory device 2100 may be configured to be electrically coupled to the system bus 3500 directly. In such a case, the function of the controller 2200 may be performed by the central processing unit 3100 and the RAM 3200.

In FIG. 9, the memory system 2000 described with reference to FIG. 8 is illustrated as being a component of the computing system 3000. However, the memory system 2000 may be replaced with the memory system 1000 described with reference to FIG. 7. In an embodiment, the computing system 3000 may be configured to include both of the memory systems 1000, 2000 described with reference to FIGS. 7 and 8.

In the various embodiments, in the program operation of the semiconductor memory device having a three-dimensional configuration, the program disturb phenomenon may be improved by programming the outermost memory cells and the memory cells adjacent to the outermost memory cells to have a relatively fewer number of program bits than the number of program bits of the remaining memory cells to decrease an electrical potential level of the outermost word line.

While various embodiments have been described above, it will be understood to those skilled in the art that the embodiments described are by way of example only. Accordingly, a semiconductor memory device, a memory system having the same, and a method of operating the same described herein should not be limited based on the described embodiments.

What is claimed is:

1. A semiconductor memory device, comprising:
   a plurality of memory cells electrically coupled between a source select transistor and a drain select transistor;
   a peripheral circuit configured to perform a program operation on the plurality of memory cells; and
   a control logic unit configured to control at least one operation of the peripheral circuit so that at least two memory cells of the plurality of memory cells adjacent to the source select transistor and at least two memory cells of the plurality of memory cells adjacent to the drain select transistor are programmed to have a relatively fewer number of data bits than that of remaining memory cells of the plurality of memory cells in the program operation, wherein the at least two memory cells respectively adjacent to the source select transistor and the drain select transistor are programmed by using a combination of a single level cell (SLC) program method and a multi level cell (MLC) program method.

2. The semiconductor memory device of claim 1, wherein the remaining memory cells are programmed to have at least three-bit data in the program operation.

3. The semiconductor memory device of claim 1, wherein a total number of data bits of the at least two memory cells adjacent to the source select transistor is equal to the number of data bits of each of the remaining memory cells, and a total number of data bits of the at least two memory cells adjacent to the drain select transistor is equal to the number of data bits of each of the remaining memory cells.

4. The semiconductor memory device of claim 1, further comprising:
   a source side dummy memory cell electrically coupled between the source select transistor and the at least two memory cells adjacent to the source select transistor; and
   a drain side dummy memory cell electrically coupled between the drain select transistor and the at least two memory cells adjacent to the drain select transistor.

5. The semiconductor memory device of claim 1, wherein the at least two memory cells adjacent to the source select transistor are each programmed to have one of a different number of data bits and a same number of data bits in the program operation.

6. The semiconductor memory device of claim 1, wherein the at least two memory cells adjacent to the drain select transistor are each programmed to have one of a different number of data bits and a same number of data bits in the program operation.

7. A semiconductor memory device, comprising:
   a plurality of memory cells electrically coupled between a source select transistor and a drain select transistor;
   a peripheral circuit configured to perform a program operation on the plurality of memory cells; and
   a control logic unit configured to control at least one operation of the peripheral circuit so that at least two first memory cells of the plurality of memory cells adjacent to the source select transistor and at least two second memory cells of the plurality of memory cells adjacent to the drain select transistor are programmed using a single level cell (SLC) program method and a multi level cell (MLC) program method, and remaining memory cells of the plurality of memory cells are programmed using a triple level cell (TLC) program method in the program operation.

8. The semiconductor memory device of claim 7, wherein the at least two first memory cells and the at least two second memory cells are programmed using a combination of the SLC program method and the MLC program method, or using the SLC program method.

9. The semiconductor memory device of claim 7, wherein a total number of data bits of the first memory cells is equal to the number of data bits of each of the remaining memory cells.

10. A memory system, comprising:
    a semiconductor memory device including a plurality of memory cells; and
    a controller configured to receive a program command from a host, and to transfer a command signal and an address for controlling a program operation of the semiconductor memory device to the semiconductor memory device,
    wherein the controller is configured to control at least one program operation of the semiconductor memory device so that at least two first memory cells of the plurality of memory cells adjacent to a source select transistor and at least two second memory cells of the plurality of memory cells adjacent to a drain select transistor are programmed to have a relatively fewer number of data bits than that of remaining memory cells of the plurality of memory cells in the program operation,
    wherein the first and the second memory cells are programmed by using a combination of a single level cell (SLC) program method and a multi level cell (MLC) program method to have a different number of data bits in the program operation.

11. The memory system of claim 10, wherein the semiconductor memory device comprises:
    a plurality of strings including the source select transistor, a source side dummy memory cell, the first memory cells, the remaining memory cells, the second memory cells, a drain side dummy memory cell, and the drain select transistor electrically coupled in series;
    a peripheral circuit configured to perform the program operation on the first memory cells, the remaining memory cells, and the second memory cells; and
    a control logic unit configured to control at least one operation of the peripheral circuit so that the first and second memory cells are programmed to have a relatively fewer number of data bits than that of the remaining memory cells according to the command signal and the address received from the controller.

12. The memory system of claim 10, wherein the remaining memory cells are programmed to have at least three data bits in the program operation.

13. The memory system of claim 10, wherein a total number of data bits of the first memory cells and a total number of data bits of the second memory cells are equal to the number of data bits of each of the remaining memory cells.

14. The memory system of claim 10, wherein the first memory cells and the second memory cells are programmed using one of the SLC program method and the MLC program to have the same number of data bits in the program operation.

15. A method of operating a semiconductor memory device including a string including a source select transistor, first memory cells, main memory cells, second memory cells, and a drain select transistor electrically coupled in series, comprising:
   programming the main memory cells to have at least three data bits; and
   programming the first memory cells adjacent to the source select transistor and the second memory cells adjacent to the drain select transistor to have a relatively fewer number of data bits than that of the main memory cells,
   wherein the first and the second memory cells are programmed by using a combination of a single level cell (SLC) program method and a multi level cell (MLC) program method.

16. The method claim 15, wherein a total number of data bits of the first memory cells is equal to the number of data bits of each of the main memory cells, and a total number of data bits of the second memory cells is equal to the number of data bits of each of the main memory cells.

17. The method claim 15, wherein each of the first memory cells and the second memory cells includes at least two memory cells.

18. The method claim 15, wherein each of the first memory cells is programmed to have one of a different number of data bits and a same number of data bits, and each of the second memory cells is programmed to have one of a different number of data bits and a or same number of data bits.

19. The semiconductor memory device of claim 7, wherein a total number of data bits of the second memory cells is equal to the number of data bits of each of the remaining memory cells.

* * * * *